United States Patent
Cheng et al.

(10) Patent No.: US 9,923,055 B1
(45) Date of Patent: Mar. 20, 2018

(54) INNER SPACER FOR NANOSHEET TRANSISTORS

(71) Applicant: International Business Machines Corporation, Armonk, NY (US)

(72) Inventors: Kangguo Cheng, Schenectady, NY (US); Ruilong Xie, Schenectady, NY (US); Tenko Yamashita, Schenectady, NY (US); Chun-chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/339,283

(22) Filed: Oct. 31, 2016

(51) Int. Cl.
| | |
|---|---|
| *H01L 21/02* | (2006.01) |
| *H01L 29/06* | (2006.01) |
| *H01L 29/66* | (2006.01) |
| *H01L 21/306* | (2006.01) |
| *H01L 21/311* | (2006.01) |
| *H01L 29/08* | (2006.01) |
| *H01L 21/3065* | (2006.01) |

(Continued)

(52) U.S. Cl.
CPC ...... *H01L 29/0665* (2013.01); *H01L 21/0217* (2013.01); *H01L 21/02181* (2013.01); *H01L 21/02532* (2013.01); *H01L 21/3065* (2013.01); *H01L 21/30608* (2013.01); *H01L 21/31111* (2013.01); *H01L 29/0649* (2013.01); *H01L 29/0847* (2013.01); *H01L 29/42392* (2013.01); *H01L 29/6653* (2013.01); *H01L 29/66553* (2013.01); *H01L 29/66742* (2013.01); *H01L 29/786* (2013.01)

(58) Field of Classification Search
None
See application file for complete search history.

(56) References Cited

U.S. PATENT DOCUMENTS

| | | |
|---|---|---|
| 8,389,416 B2 | 3/2013 | Luong |
| 9,362,355 B1 | 6/2016 | Cheng et al. |
| 2014/0339611 A1 | 11/2014 | Leobandung |

(Continued)

OTHER PUBLICATIONS

List of IBM Patents or Patent Applications Treated as Related; YOR920161224US1, Date Filed: Oct. 31, 2016, pp. 1-2.

(Continued)

*Primary Examiner* — Robert Carpenter
(74) *Attorney, Agent, or Firm* — Cantor Colburn LLP; David Quinn

(57) ABSTRACT

Embodiments are directed to a method of fabricating inner spacers of a nanosheet FET. The method includes forming sacrificial and channel nanosheets over a substrate, removing sidewall portions of the sacrificial nanosheet, and forming a dielectric that extends over the channel nanosheet and within a space that was occupied by the removed sidewall portions of the sacrificial nanosheet. The method further includes forming a top protective spacer over the channel nanosheet and the dielectric, as well as applying a directional etch to the top protective spacer, the channel nanosheet, and the dielectric, wherein the directional etch is configured to be selective to the channel nanosheet and the dielectric, wherein the directional etch is configured to not be selective to the top protective spacer, and wherein applying the directional etch etches portions of the channel nanosheet and portions of the flowable dielectric that are not under the top dielectric.

19 Claims, 13 Drawing Sheets

(51) Int. Cl.
*H01L 29/423* (2006.01)
*H01L 29/786* (2006.01)

(56) References Cited

U.S. PATENT DOCUMENTS

| | | |
|---|---|---|
| 2016/0071729 A1 | 3/2016 | Hatcher et al. |
| 2016/0126310 A1 | 5/2016 | Rodder et al. |
| 2016/0365411 A1 | 12/2016 | Yeh et al. |
| 2017/0053982 A1 | 2/2017 | Cai et al. |

OTHER PUBLICATIONS

List of IBM Patents or Patent Applications Treated as Related; Date Filed: Oct. 31, 2016, 2 pages.

INNER SPACER FOR NANOSHEET TRANSISTORS

BACKGROUND

The present invention relates in general to semiconductor devices and their manufacture. More specifically, the present invention relates to the fabrication of vertically stacked nanosheet transistors having inner spacers and improved source to drain sheet resistance.

In contemporary semiconductor device fabrication, a large number of semiconductor devices, such as field effect transistors (FETs), are fabricated on a single wafer. Non-planar transistor device architectures, such as vertical field effect transistors (VFETs) and nanosheet (a.k.a., nanowire) transistors, can provide increased device density and increased performance over planar transistors. In nanosheet transistors, in contrast to conventional planar FETs, the gate stack wraps around the full perimeter of multiple nanosheet channel regions, which enables fuller depletion in the channel regions and reduces short-channel effects.

SUMMARY

Embodiments of the present invention are directed to a method of fabricating inner spacers of a nanosheet field effect transistor. The method includes forming a sacrificial nanosheet and a channel nanosheet over a substrate, removing a sidewall portion of the sacrificial nanosheet, and forming a dielectric that extends over the channel nanosheet and within a space that was occupied by the removed sidewall portion of the sacrificial nanosheet. The method further includes forming a top protective spacer over the channel nanosheet and the dielectric, as well as applying a directional etch to the top protective spacer, the channel nanosheet, and the dielectric, wherein the directional etch is configured to be selective to the channel nanosheet and the dielectric, wherein the directional etch is configured to not be selective to the top protective spacer, and wherein applying the directional etch etches a portion of the channel nanosheet and a portion of the dielectric that are not under the top protective spacer. In some embodiments of the invention, the dielectric comprises a flowable dielectric.

Embodiments of the present invention are directed to a method of fabricating inner spacers of a nanosheet field effect transistor. The method includes forming a substrate and forming a sacrificial nanosheet over the substrate. The method further includes forming a channel nanosheet over the sacrificial nanosheet and forming a dummy gate over the channel nanosheet. The method further includes removing a sidewall portion of the sacrificial nanosheet. The method further includes forming a dielectric that extends over the channel nanosheet and within a space that was occupied by the removed sidewall portion of the sacrificial nanosheet. The method further includes forming a top protective spacer over the dummy gate, wherein the top protective spacer includes a predetermined width dimension. The method further includes applying a directional etch to the top protective spacer, the channel nanosheet, and the dielectric, wherein the directional etch is configured to be selective to the channel nanosheet and the dielectric, wherein the directional etch is configured to not be selective to the top protective spacer, wherein applying the directional etch etches a portion of the channel nanosheet and a portion of the dielectric that are not under the top protective spacer, wherein the portion of the dielectric that is under the top protective spacer and within the space that was occupied by the removed sidewall portion of the sacrificial nanosheet includes a diffusion block, wherein, subsequent to applying the directional etch, a width dimension of the channel substrate is substantially the same as the width dimension of the channel nanosheet, and wherein, subsequent to applying the directional etch, a vertical sidewall of the diffusion block is substantially planar with a vertical sidewall of the channel nanosheet. In some embodiments of the invention, the dielectric comprises a flowable dielectric.

Embodiments of the present invention are further directed to a nanosheet field effect transistor that includes a substrate, an isolation region formed over the substrate, a diffusion block formed over the isolation region, and a nanosheet formed over the diffusion block. The transistor further includes a source region and a drain region positioned such that the diffusion block and the nanosheet channel are adjacent the source region or the drain region. The transistor further includes a trench formed in the isolation region and under the source or the drain region, wherein an inner sidewall of the trench is aligned with a vertical sidewall of the diffusion block.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1:
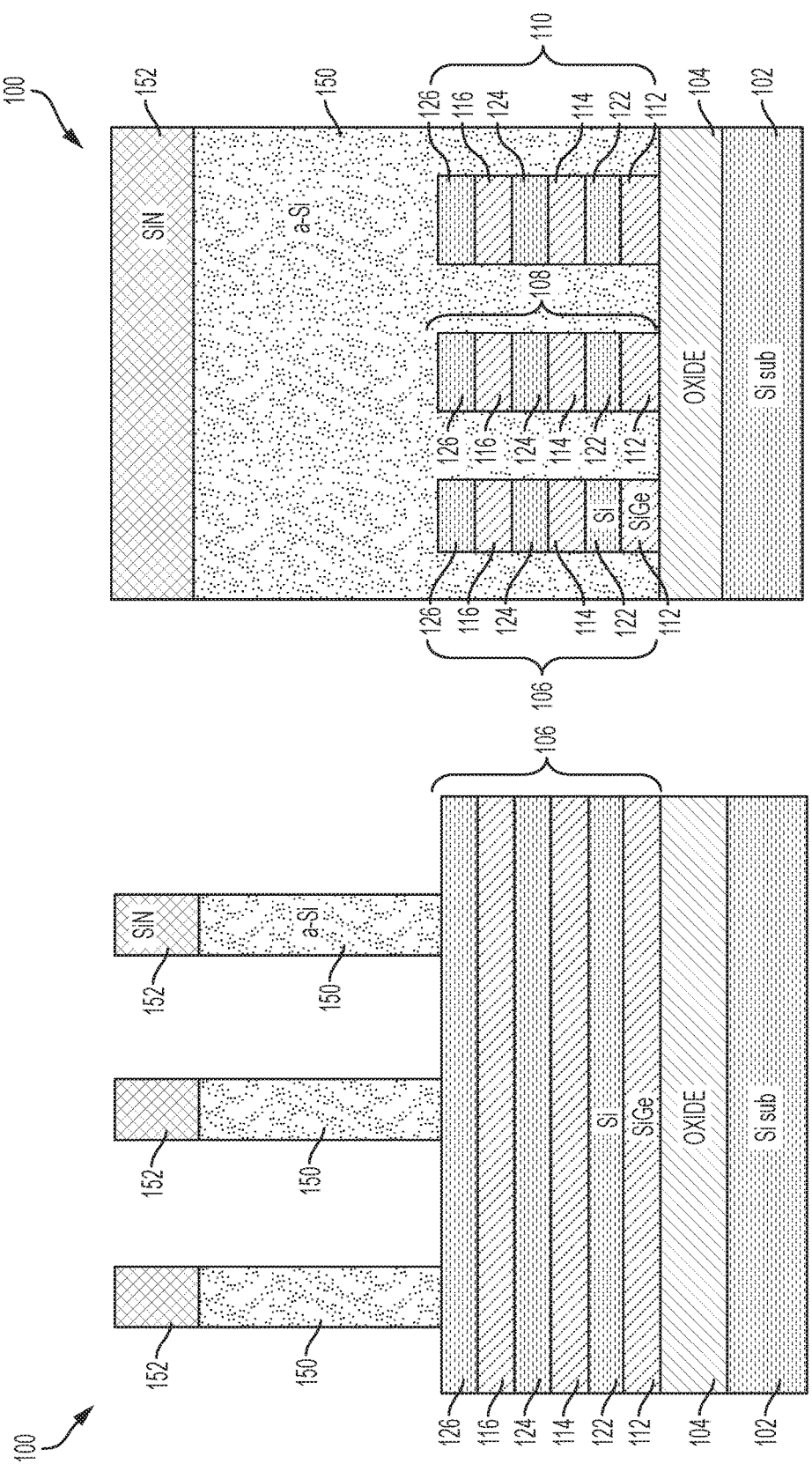
FIG. 1A depicts a cross-sectional view of a semiconductor device after a fabrication stage according to one or more embodiments of the present invention.
FIG. 1B depicts a cross-sectional view of the semiconductor device shown in FIG. 1A, taken along line B-B.

It is understood in advance that although this description includes a detailed description of an exemplary n-type GAA nanosheet FET architecture having silicon channel nanosheets and silicon germanium sacrificial nanosheets, implementation of the teachings recited herein are not limited to the particular FET architecture described herein. Rather, embodiments of the present invention are capable of being implemented in conjunction with any other type of FET device now known or later developed, including, for example, p-type GAA nanosheet FET architectures having silicon germanium channel nanosheets and silicon sacrificial nanosheets.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The phrase "direct contact" means that a first element, such as a first structure, and a second element, such as a second structure, are connected without any intermediary conducting, insulating or semiconductor layers at the interface of the two elements. It should be noted that the phrase "selective to," such as, for example, "a first element selective to a second element," means that a first element can be etched and the second element can act as an etch stop. The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, the previously described GAA nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are silicon (Si) and the sacrificial nanosheets are silicon germanium (SiGe). For p-type FETs, the channel nanosheets are SiGe and the sacrificial nanosheets are Si. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si. However, the inclusion of stacked, strained Si/SiGe nanosheet/sacrificial layers in the channel region of a GAA nanosheet FET structure makes junction design and $R_{ext}$ reduction difficult. A reduction in $R_{ext}$ would lead to enhanced driver current performance.

Accordingly, embodiments of the present invention provides fabrication methodologies and resulting devices for forming stacked nanosheet channel transistors having improved source to drain sheet resistance. The semiconductor device fabrication methodology includes processes to form a stacked nanosheet structure that will form the channel region of the final semiconductor device. The stacked nanosheet structure includes channel nanosheets and sacrificial nanosheets. The sacrificial nanosheets will be removed and released from the channel nanosheets that will form the channel region of the device.

In one or more embodiments, a diffusion block is locally formed between the sacrificial layers and the source and drain regions of the device. According to one or more embodiments of the present invention, the diffusion block is formed in a manner that avoids the possibility of, during formation of the diffusion block, undercutting the material that forms the diffusion block or leaving residuals of the material that forms the diffusion block. According to one or more embodiments of the present invention, a top protective spacer is formed to define the desired final width dimensions of the channel nanosheets, as well as the desired vertical sidewall alignment between the diffusion block and the channel nanosheets. In one or more embodiments, a directional etch (e.g., a RIE) that is non-selective to the top protective spacer is applied to achieve multiple results. One result is that the directional etch operation etches the channel nanosheets to their desired final width dimension (Wf). A second result is that the same directional etch operation forms the diffusion block 1102. A third result is that the same directional etch operation aligns the vertical sidewalls of the channel nanosheets such that they are substantially planar with the vertical sidewalls of the diffusion blocks. Thus, the top protective spacer and directional etch according to embodiments of the present invention avoids the possibility of, during formation of the diffusion block, undercutting the material that is used to form the diffusion block or leaving residuals of the material that is used to form the diffusion block.

The diffusion block is positioned such that processes that remove the sacrificial nanosheets during device fabrication do not also attack the source and drain regions of the device. As described in greater detail herein below, the diffusion block can be formed from nitride, which prevents excess gauging during certain reactive ion etch (RIE) processes that can be applied during the sacrificial nanosheet removal process of the overall device fabrication process. Although the diffusion block in the described embodiments is formed from nitride, it can be formed from any material for which subsequent device fabrication operations are not very selective. Selectivity, as used in the present description, refers to the tendency of a process operation to impact a particular material. One example of low selectivity is a relatively slow etch rate. One example of a higher or greater selectivity is a relatively faster etch rate. For the described embodiments, a material for the diffusion block is selected based on a selectivity of subsequent device fabrication operations for the selected material being below a predetermined threshold.

FIGS. 1A-12 are diagrams illustrating a semiconductor structure 100 after selected stages of a fin-first, wire-last replacement gate fabrication methodology for forming an exemplary n-type GAA nanosheet FET according to one or more embodiments of the present invention. As described in greater detail herein below, in accordance with one or more embodiments of the present invention, a diffusion block section is formed locally and positioned between a sacrificial nanosheet layer of the nanosheet FET device and the source and drain regions of the nanosheet FET device. The diffusion block is positioned such that a process that removes the sacrificial layer during device fabrication does not also attack the source and drain regions of the nanosheet FET device.

FIG. 1A depicts a cross-sectional view of the semiconductor device 100 having a nanosheet stack 106 formed from an alternating series of silicon germanium (SiGe) sacrificial nanosheets 112, 114, 116 and silicon (Si) channel nanosheets 122, 124, 126. The nanosheet stack 106 is formed on an oxide isolation layer 104, which is formed on a silicon substrate 102. FIG. 1B depicts a cross-sectional view of the semiconductor device 100 shown in FIG. 1A taken along line B-B. As shown in FIG. 1B, nanosheet stacks 108, 110 are positioned behind nanosheet stack 106. For ease of illustration, six alternating nanosheets 112, 122, 114, 124, 116, 126 are shown. However, one or more additional sacrificial nanosheets and/or channel nanosheets can optionally be epitaxially grown in an alternating fashion, wherein the properties of the additional sacrificial nanosheet (s) are the same as sacrificial nanosheets 112, 114, 114 and the properties of the additional channel nanosheets are the same as channel nanosheets 122, 124, 126.

In one or more embodiments, the alternating series of silicon germanium sacrificial nanosheets 112, 114, 116 and silicon channel nanosheets 122, 124, 126 are formed by epitaxially growing one layer and then the next until the desired number and desired thicknesses of the nanosheets are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Known processing techniques have been applied to the alternating series of silicon germanium sacrificial nanosheets 112, 114, 116 and silicon channel nanosheets 122, 124, 126 shown in FIG. 1A to form the nanosheet stacks 106, 108, 110 shown in FIG. 1B. For example, the known processing techniques can include the formation of fin hard masks (not shown) over silicon channel nanosheet 126. The fin hard masks can be formed by first depositing the hard mask material (for example silicon nitride) onto silicon channel nanosheet 126 using, for example, chemical vapor deposition (CVD), plasma enhanced CVD (PECVD) or any suitable technique for dielectric deposition that does not induce a physical or chemical change to silicon channel nanosheet 126. According to an exemplary embodiment, the hard mask material is deposited onto silicon channel 126. The deposited hard mask material is then patterned into a plurality of the individual fin hard masks. The patterning of the hard masks is commensurate with a desired footprint and location of the channel nanosheet stacks 106, 108, 110 shown in FIG. 1B, which will be used to form the channel regions of the semiconductor device. According to an exemplary embodiment, RIE is used to etch through the alternating series of silicon germanium sacrificial nanosheets 112, 114, 116 and silicon channel nanosheets 122, 124, 126 to form the nanosheet stacks 106, 108, 110 shown in FIG. 1B.

FIGS. 1A and 1B also depict dummy gates 150 and hard masks (HM) 152 formed over and around the nanosheet gate stacks 106, 108, 110. As best shown in FIG. 1B, dummy gates 150 are formed over the tops and sidewalls of the nanosheet stacks 106, 108, 110. In one or more embodiments, the dummy gates 150 are formed from amorphous silicon (a-Si), and hard masks 152 are formed from silicon nitride (SiN), silicon oxide, an oxide/nitride stack, or similar materials and configurations.

Figure 2:
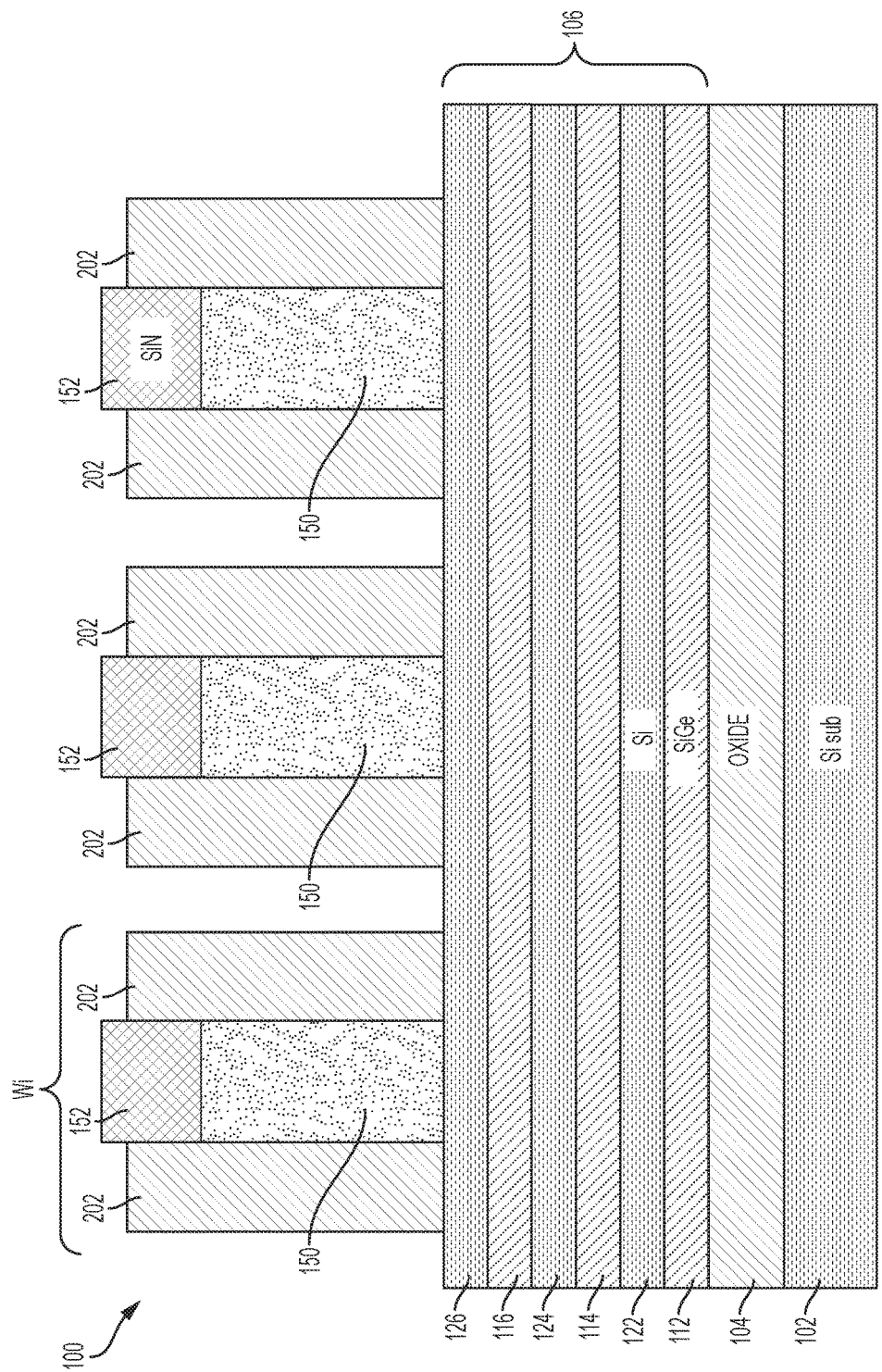
FIG. 2 depicts a perspective view of a semiconductor device after a fabrication stage according to one or more embodiments of the present invention.

FIG. 2 depicts a cross-sectional view of the semiconductor device 100 after a next fabrication stage. As shown in FIG. 2, offset spacers 202 have been formed along the sidewalls of the dummy gates 150, as shown. Offset spacers 202 can be formed using a spacer pull down formation process. Offset spacers 202 can also be formed using a sidewall image transfer (SIT) spacer formation process, which includes spacer material deposition followed by directional RIE of the deposited spacer material. The width dimensions of the offset spacers 202 are chosen such that the offset spacers 202 and the hard masks 152 define an initial width (Wi).

Figure 3:
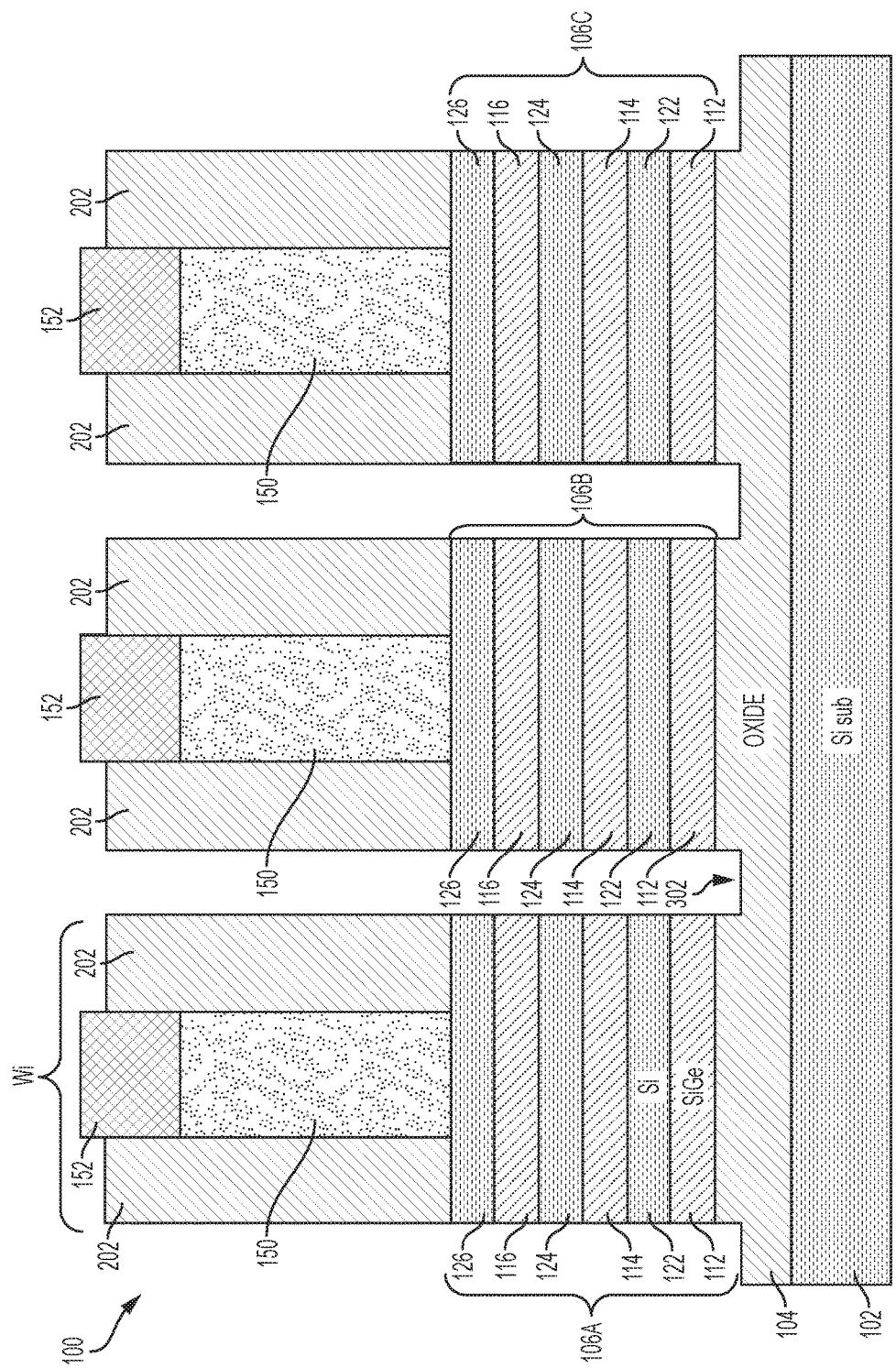
FIG. 3 depicts a cross-sectional view of a semiconductor device after a fabrication stage according to one or more embodiments of the present invention.

FIG. 3 depicts a cross-sectional view of the semiconductor device 100 after a next fabrication stage. As shown in FIG. 3, the offset spacers 202 are in effect used as a mask, and portions of the silicon germanium sacrificial nanosheets 112, 114, 116, the silicon channel nanosheets 122, 124, 126, and the oxide isolation 104 that are not under the offset spacers 202 and the dummy gates 150 are recessed into the oxide isolation layer 104 (forming a trench 302) using a silicon RIE process.

As described in greater detail herein below, portions of silicon nanosheets 122, 124, 126, once released from the silicon germanium sacrificial nanosheets 112, 114, 116, will form the nanosheet channels of the semiconductor device. Because the fin etch is being performed before the dummy gate/replacement gate steps (described in greater detail later herein), the semiconductor device fabrication processes described herein can be referred to as a fin first process. Additionally, because the silicon nanosheet channels 122, 124, 126 will be released from the silicon germanium sacrificial nano sheets 112, 114, 116 after the dummy gate/replacement gate steps, the semiconductor device fabrication process described herein can also be referred to as a wire last process.

Figure 4:
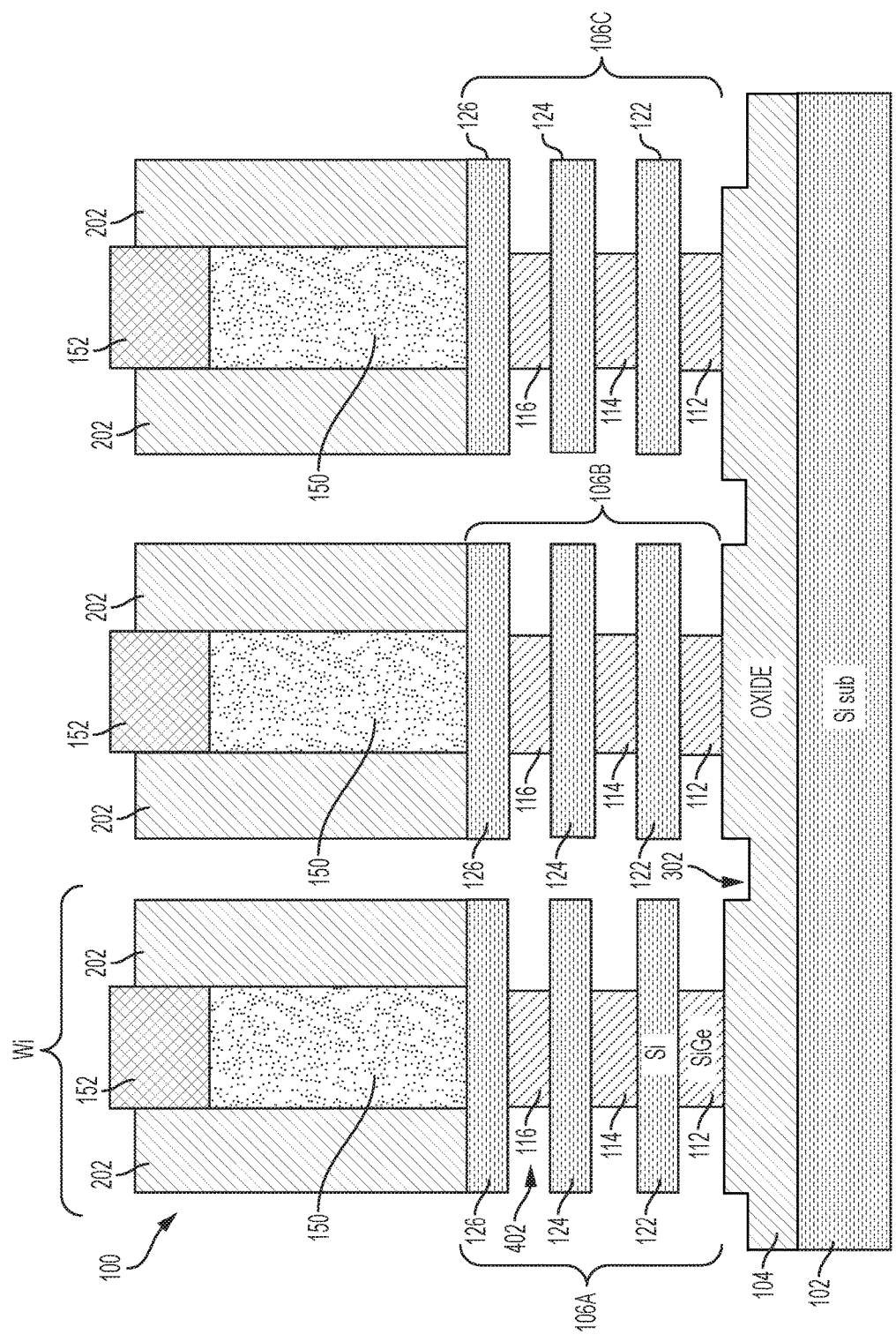
FIG. 4 depicts a perspective view of a semiconductor device after a fabrication stage according to one or more embodiments of the present invention.

FIG. 4 depicts a cross-sectional view of the semiconductor device 100 after a next fabrication stage. As shown in FIG. 4, silicon germanium sacrificial nanosheets 112, 114, 116 have been pulled back from underneath offset spacers 202 using a hydrogen chloride (HCL) gas isotropic etch process, which etches silicon germanium without attacking silicon. Cavities 402 are formed by spaces that were occupied by the removed portions of silicon germanium sacrificial nanosheets 112, 114, 116.

Figure 5:
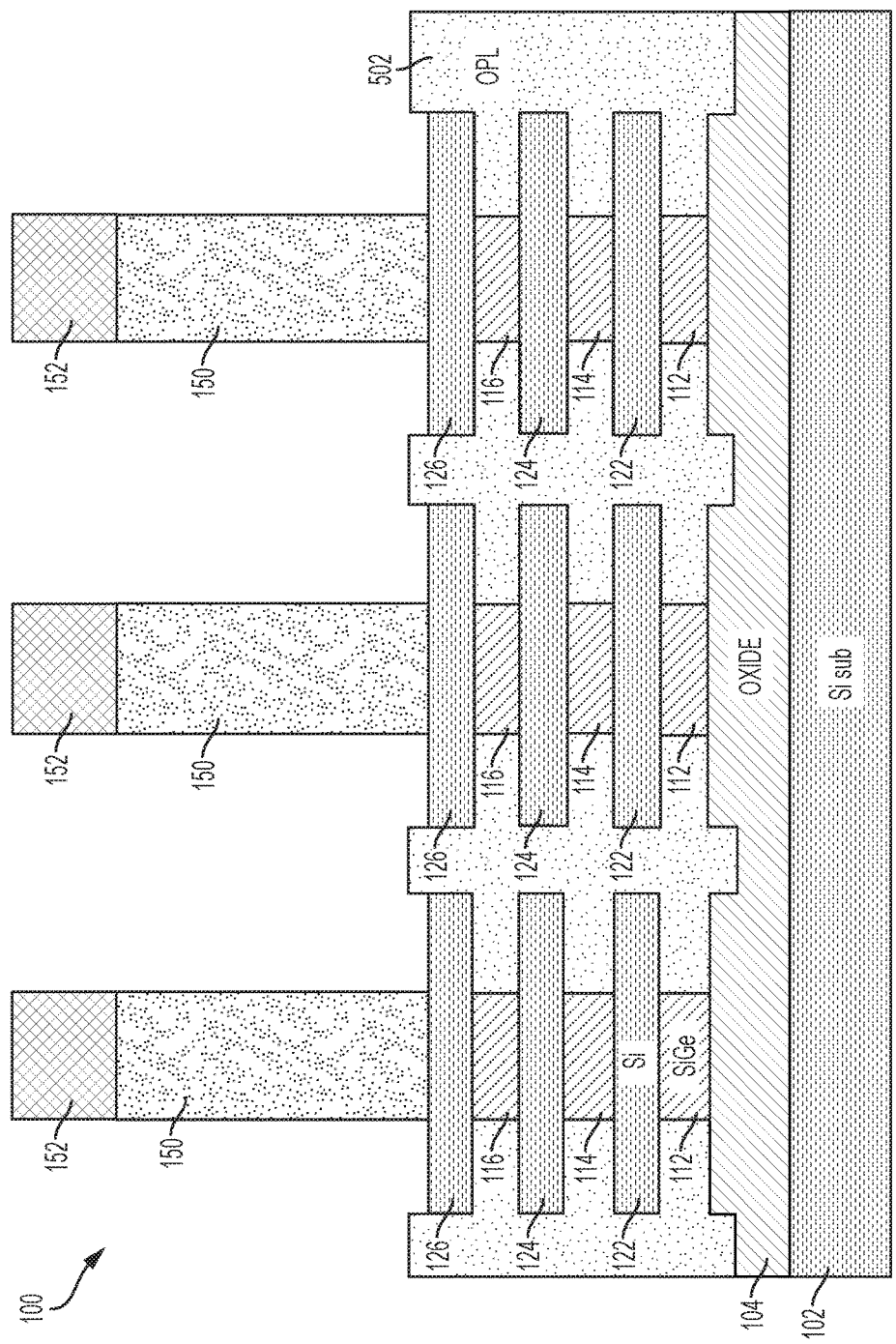
FIG. 5 depicts a cross-sectional view of a semiconductor device after a fabrication stage according to one or more embodiments of the present invention.
Figure 6:
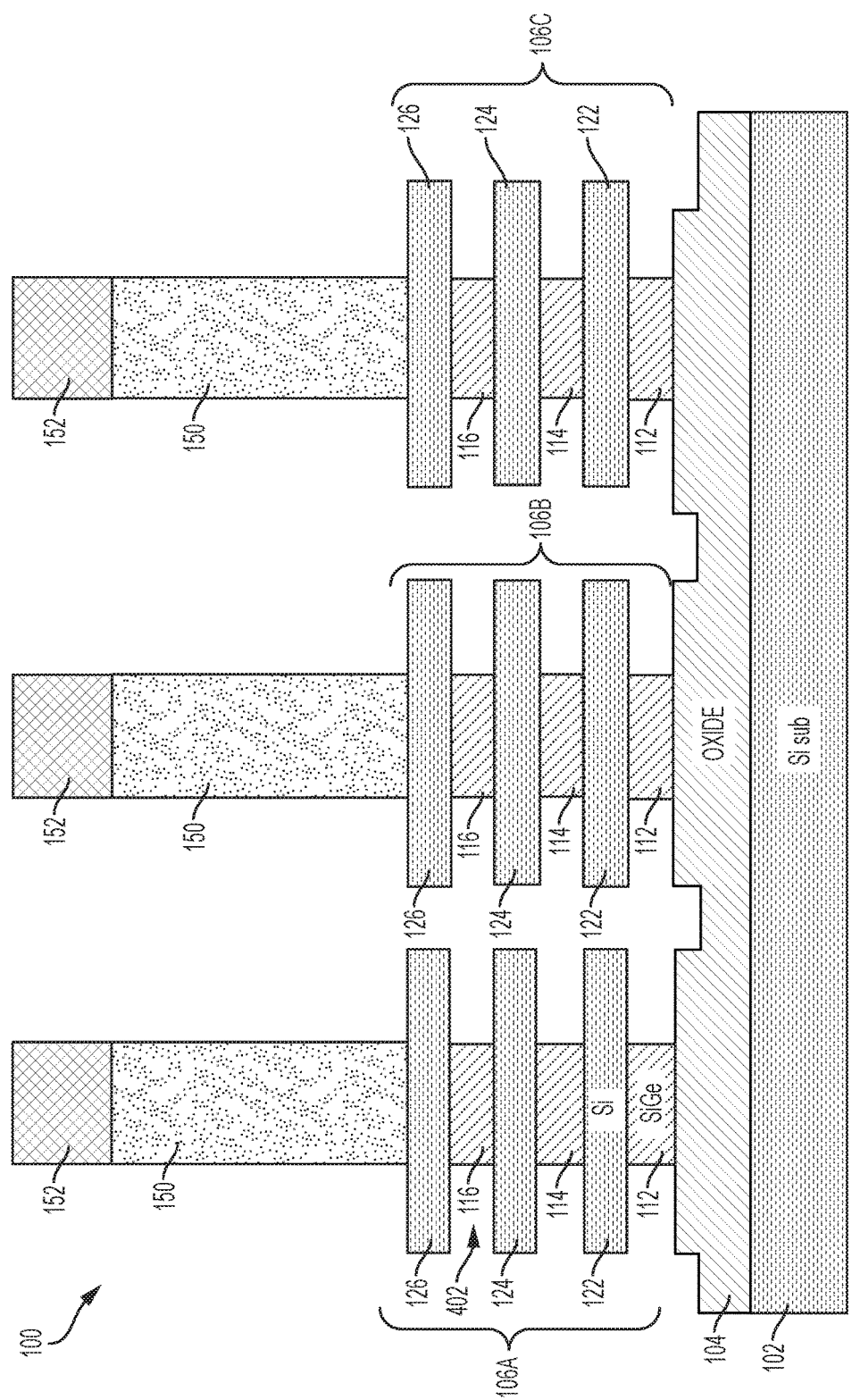
FIG. 6 depicts a perspective view of a semiconductor device after a fabrication stage according to one or more embodiments of the present invention.

FIG. 5 depicts a cross-sectional view of the semiconductor device 100 after a next fabrication stage. As shown in FIG. 5, a protective organic planarization layer (OPL) 502 (i.e., an oxide-based flowable dielectric) has been deposited, and, after the OPL deposition, the offset spacers 202 have been removed. The organic planarization layer 502 protects the bottom portions of the semiconductor structure 100 from the process used to remove the offset spacers 202. As depicted in FIG. 6, after removal of the offset spacers 202, the protective organic planarization layer 502 has been removed.

Figure 7:
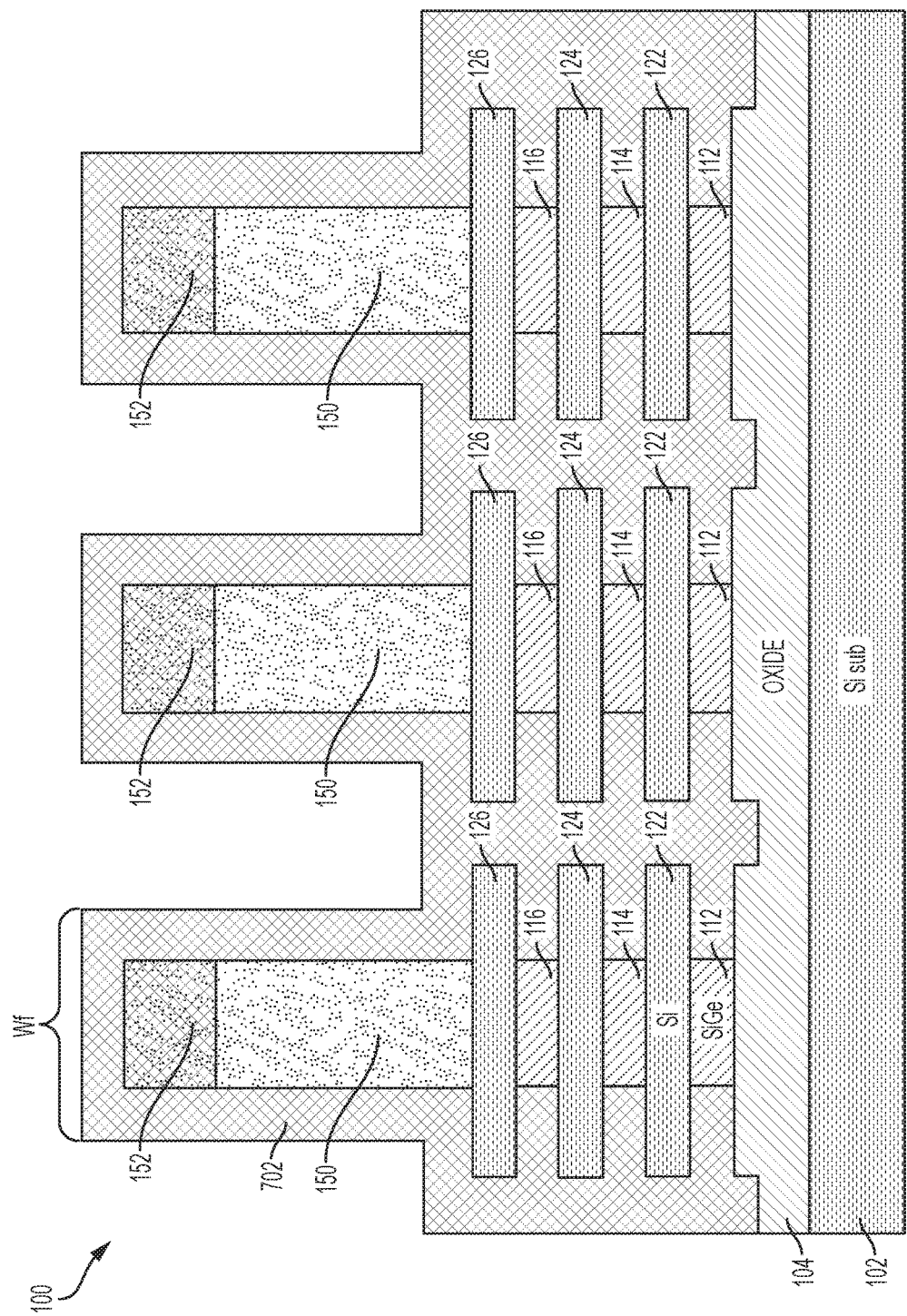
FIG. 7 depicts a cross-sectional view of a semiconductor device after a fabrication stage according to one or more embodiments of the present invention.

FIG. 7 depicts a cross-sectional view of the semiconductor device 100 after a next fabrication stage. As shown in FIG. 7, a spacer 702 is conformally deposited over the semiconductor structure 100. Specifically, portions 702A of spacer 702 fill in the cavities 402 (shown in FIG. 4). Additionally, the thickness dimension of the spacer 702 is selected to provide a final width dimension (WO over the hard masks 152. In one or more embodiments, the spacer 702 is a nitride.

Figure 8:
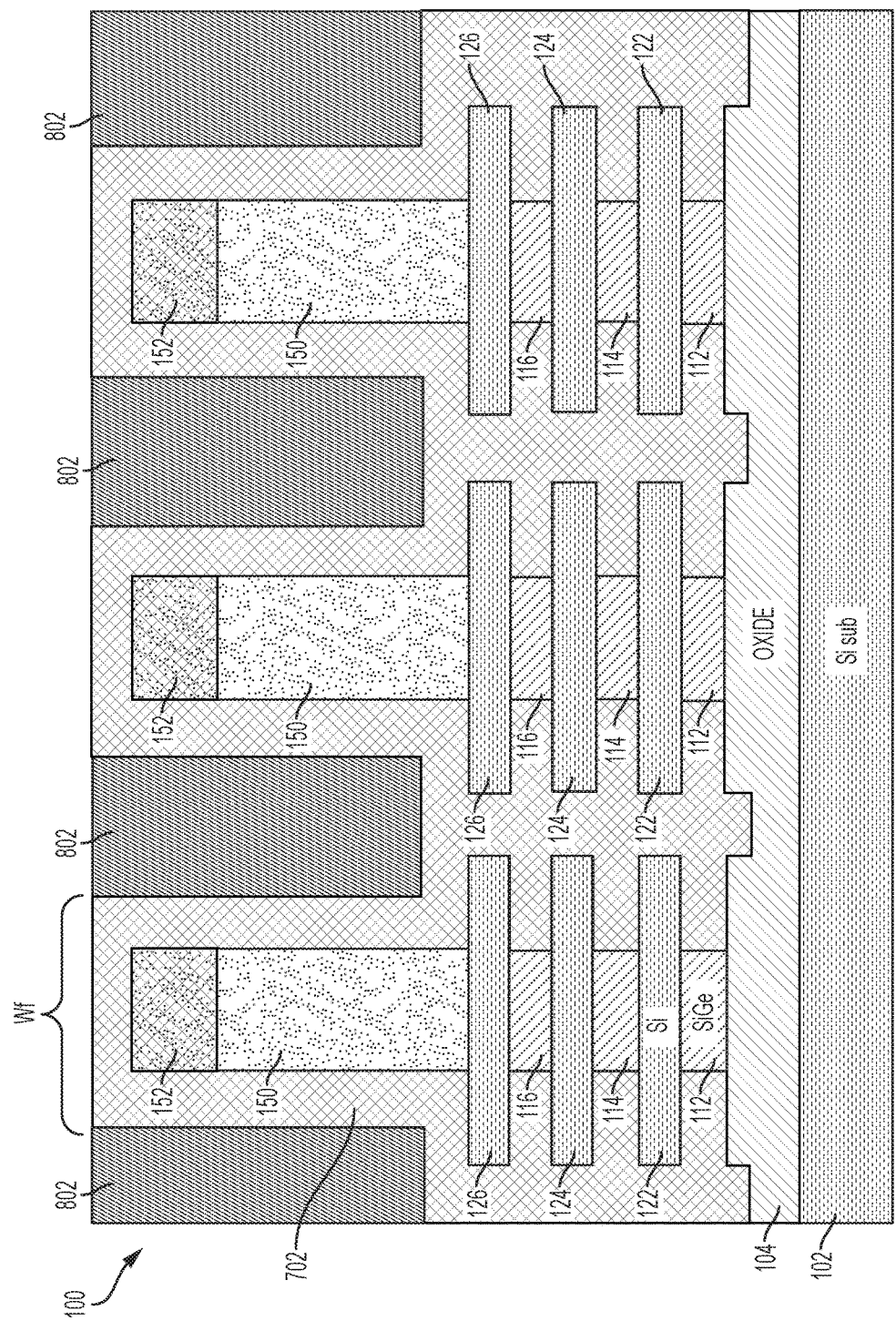
FIG. 8 depicts a perspective view of a semiconductor device after a fabrication stage according to one or more embodiments of the present invention.

FIG. 8 depicts a cross-sectional view of the semiconductor device 100 after a next fabrication stage. As shown in FIG. 8, a sacrificial protective layer 802 is deposited and configured and arranged as shown.

Figure 9:
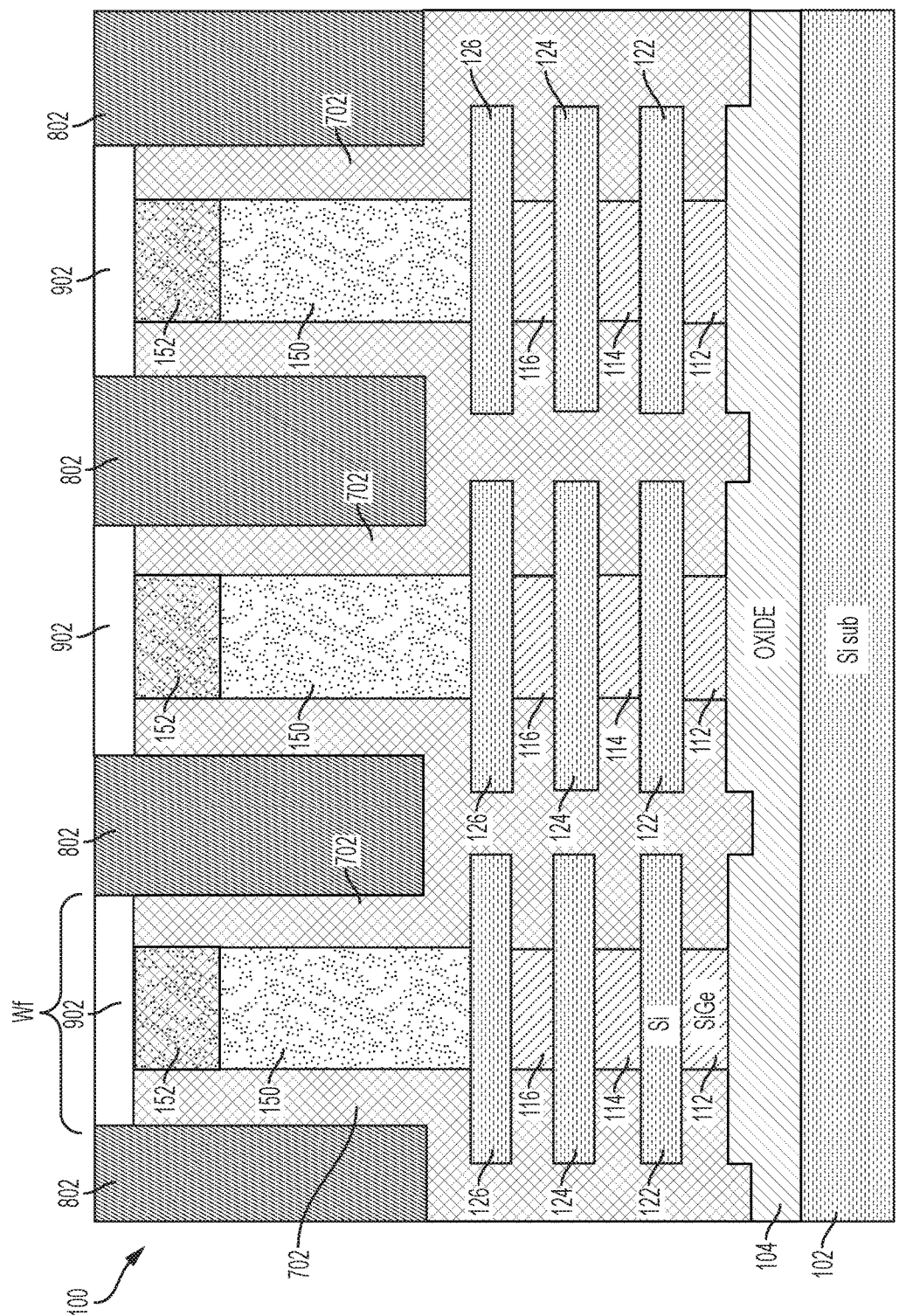
FIG. 9 depicts a cross-sectional view of a semiconductor device after a fabrication stage according to one or more embodiments of the present invention.

FIG. 9 depicts a cross-sectional view of the semiconductor device 100 after a next fabrication stage. As shown in FIG. 9, a top protective spacer 902 is formed. In one or more embodiments, the top protective spacer 902 is formed by treating a top portion of the spacer 702. In one or more embodiments, treating the top portion of the spacer 702 includes hardening the spacer nitride material at the top portion of the spacer 702 by applying a plasma treatment. In one or more embodiments, the top protective spacer 902 is formed by recessing the top portion of the spacer 702 and replacing the recessed top portion of the spacer 702 with the top protective spacer 902. In one or more embodiments, the top protective spacer 902 is hafnium oxide ($HfO_2$). As shown in FIG. 9, the width dimension (Wf) of the top protective spacer 902 is selected to match the desired final width dimension of the silicon channels 122, 124, 126.

Figure 10:
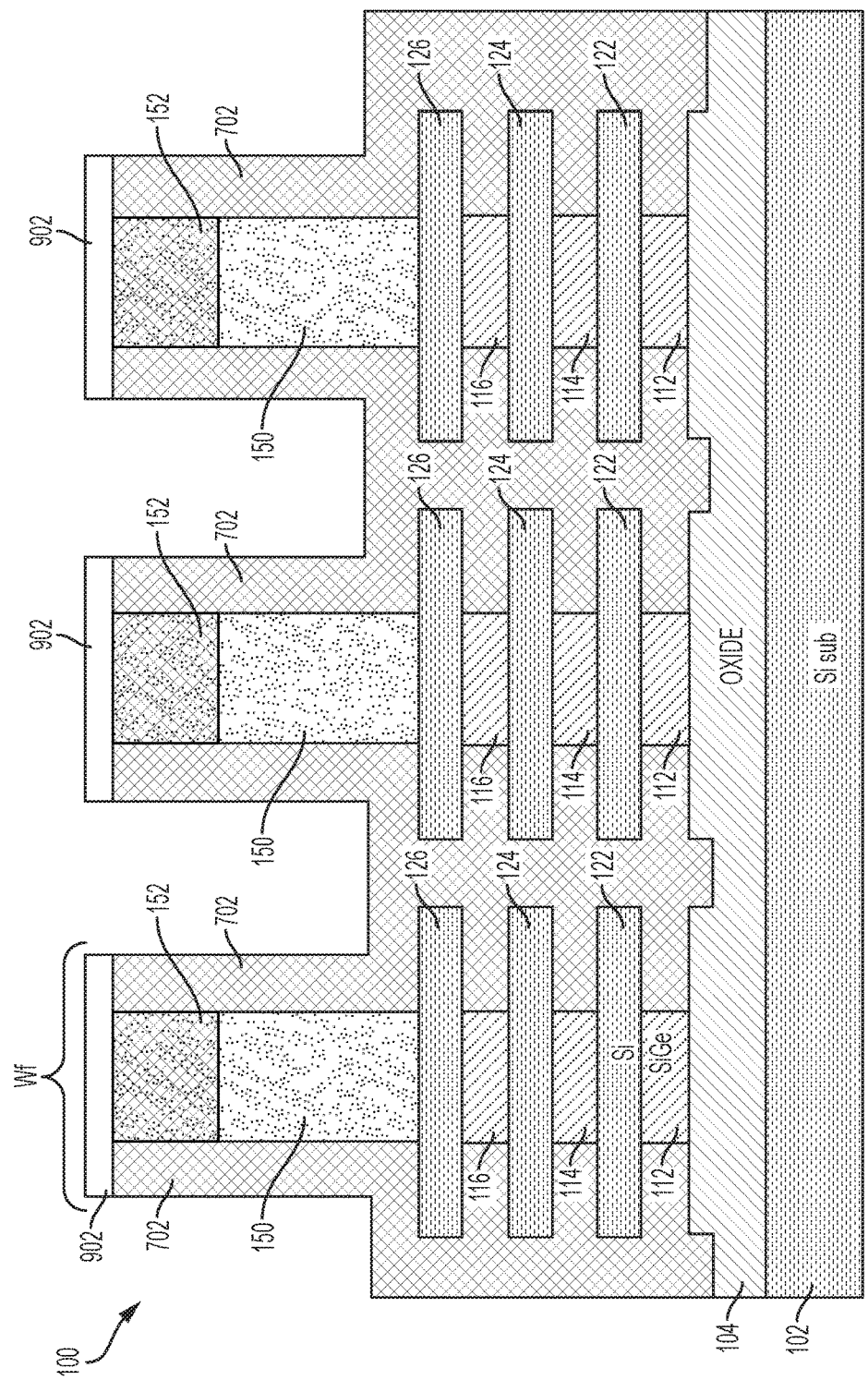
FIG. 10 depicts a perspective view of a semiconductor device after a fabrication stage according to one or more embodiments of the present invention.

FIG. 10 depicts a cross-sectional view of the semiconductor device 100 after a next fabrication stage. As shown in FIG. 10, the sacrificial protective layer 802 has been removed.

Figure 11:
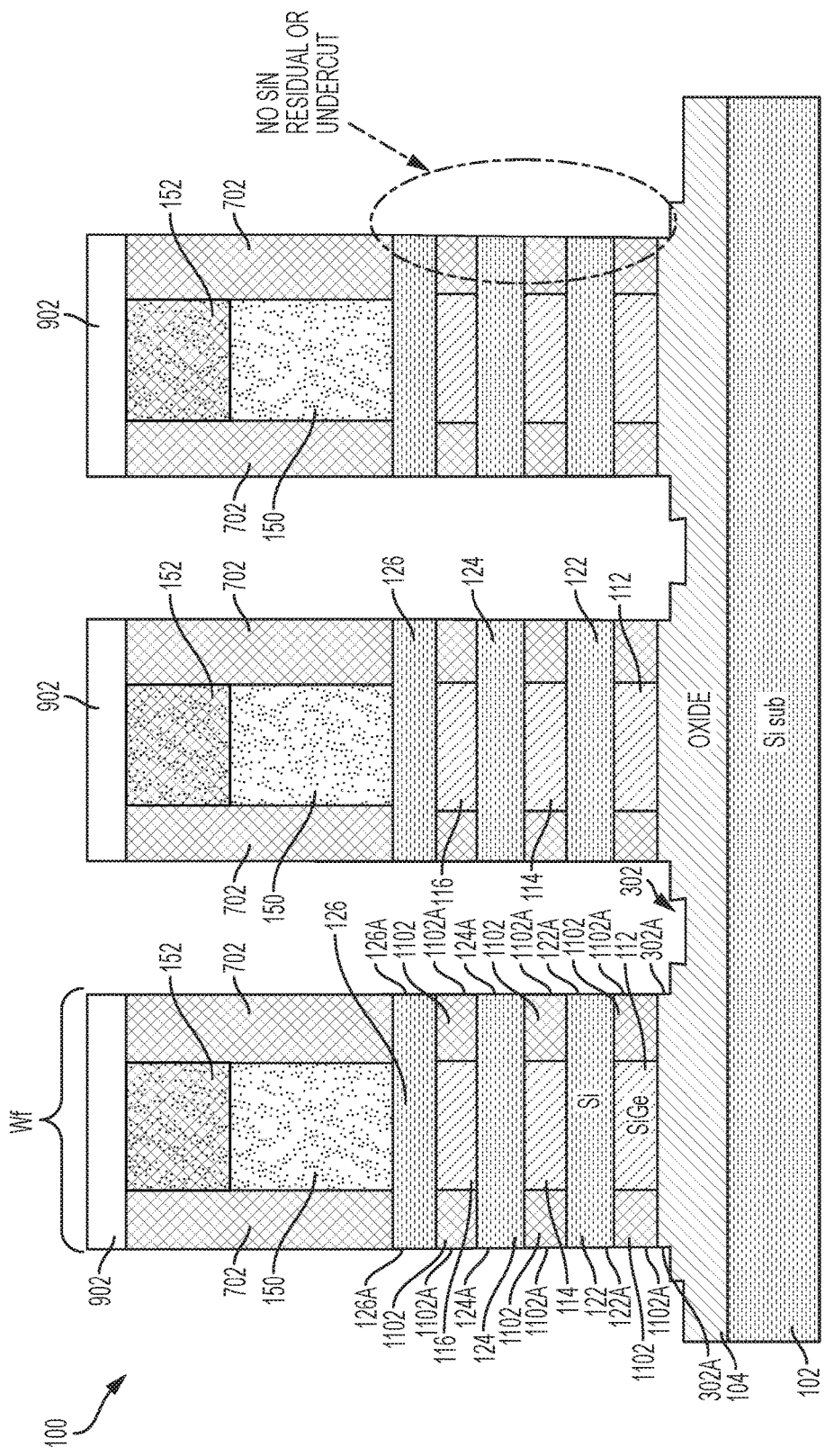
FIG. 11 depicts a cross-sectional view of a semiconductor device after a fabrication stage according to one or more embodiments of the present invention.

FIG. 11 depicts a cross-sectional view of the semiconductor device 100 after a next fabrication stage. As shown in FIG. 11, according to an exemplary embodiment, a directional etch, such as RIE, is used to etch through the portions of the spacer 702 and the alternating series of silicon germanium sacrificial nanosheets 112, 114, 116 and silicon channel nanosheets 122, 124, 126 that are not under and protected by the top protective spacer 902. The RIE also etches further into the trench 302 but not far enough through the oxide layer 104 to contact or etch the substrate 106, thereby forming a stepped trench profile having a trench sidewall 302A. The RIE performs several functions. First, the RIE etches the silicon channels 122, 124, 126 to their desired final width dimension (Wf). Second, the same RIE operation forms the previously described diffusion block 1102. Third, the same RIE operation aligns the vertical sidewalls 122A, 124A, 126A of the silicon channel nanosheets 122, 124, 126 such that they are substantially planar with the vertical sidewalls 1102A of the diffusion blocks 1102, as well as inner sidewalls 302A of the oxide trench 302. Using the RIE operation avoids the possibility of, during formation of the diffusion block 1102, undercutting the spacer 702 or leaving residuals of the spacer 702.

Diffusion blocks 1102 are positioned such that subsequent etching processes that remove the silicon germanium sacrificial nanosheets 112, 114, 116 during device fabrication do not also attack the source/drain (S/D) regions 1202 (shown in FIG. 12) of the semiconductor structure 100. Diffusion blocks 1102 can be formed from a nitride containing material (e.g., silicon nitride (SiN)), which prevents excess gauging during subsequent RIE processes (e.g., sacrificial layer removal) that are applied during the semiconductor device fabrication process. Although diffusion blocks 1102 shown in FIG. 11 are formed from a nitride containing material, they can be formed from any material for which subsequent device fabrication operations are not very selective. Selectivity, as used in the present description, refers to the tendency of a process operation to impact a particular material. One example of low selectivity is a relatively slow etch rate. One example of a higher or greater selectivity is a relatively faster etch rate. For the described embodiments, a material for diffusion blocks 1102 is selected based on a selectivity of subsequent device fabrication operations for the selected material being below a predetermined threshold.

Figure 12:
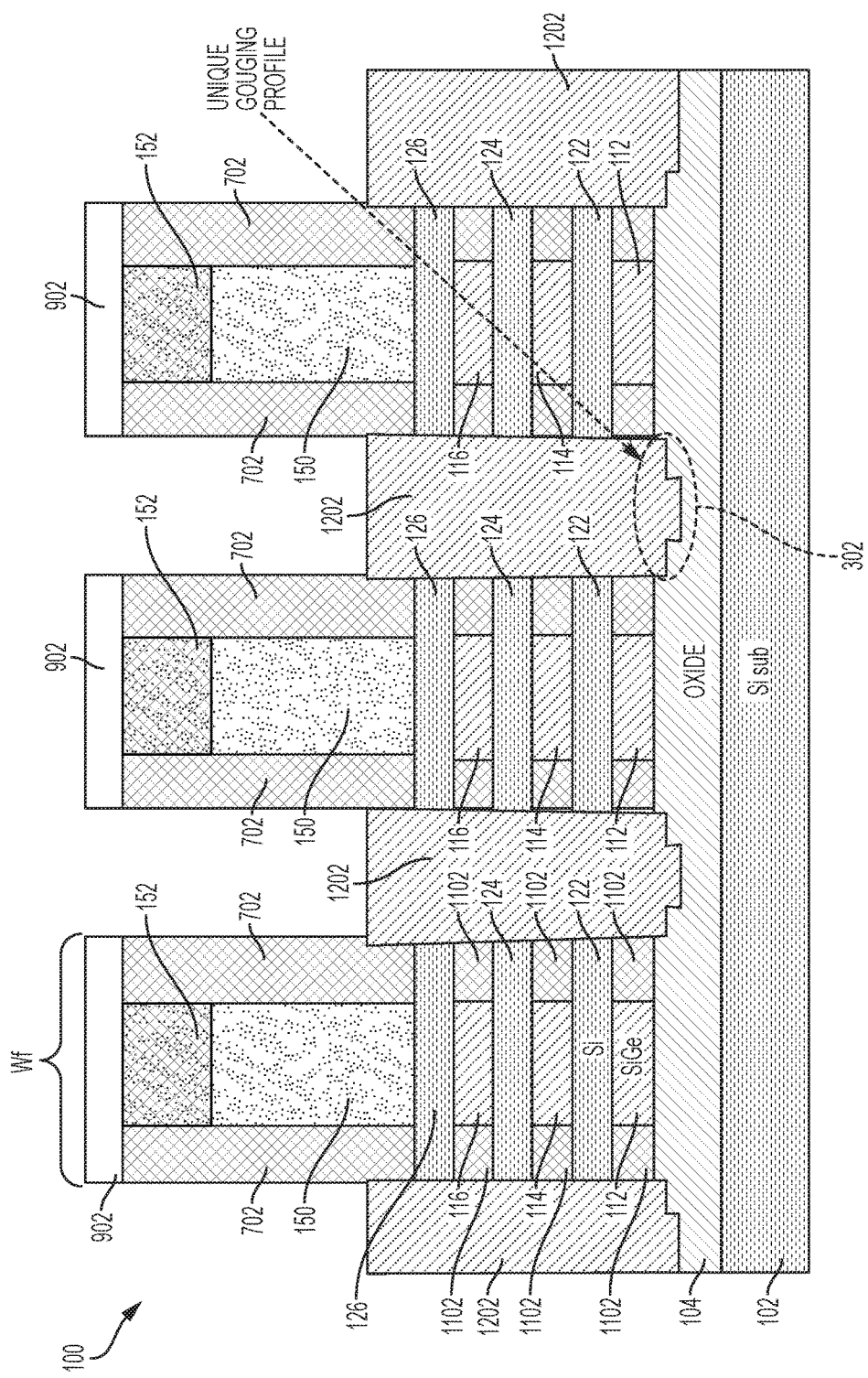
FIG. 12 depicts a perspective view of a semiconductor device after a fabrication stage according to one or more embodiments of the present invention.

FIG. 12 depicts the semiconductor device 100 after a next fabrication stage. As shown in FIG. 12, raised S/D regions 1202 are formed using an epitaxial layer growth process on the ends of exposed silicon channel nanosheets 122, 124, 126. In-situ doping (ISD) is applied to form doped S/D regions 1202, thereby creating the necessary junctions of the semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

The dummy gates 150 and the silicon germanium sacrificial nanosheets 112, 114, 116 are removed by a known etching process, e.g., RIE or chemical oxide removal (COR). In a gate-late fabrication process, the removed dummy gate structure 150 is thereafter replaced with a metal gate (not shown) as known in the art. Dummy gate 150 can be removed by an etching process, e.g., RIE or COR, to form a trench. A dielectric material and one or more gate metals (not shown) can then be deposited within the trench. For example, an HK dielectric material, e.g., hafnium based material, can be deposited to form a gate dielectric. A metal liner, e.g., a work-function metal, and a gate metal can then be deposited on the dielectric material to complete the gate formation. In one or more embodiments, the metal liner can be, for example, TiN or TaN, and the gate metal can be aluminum or tungsten.

Figure 13:
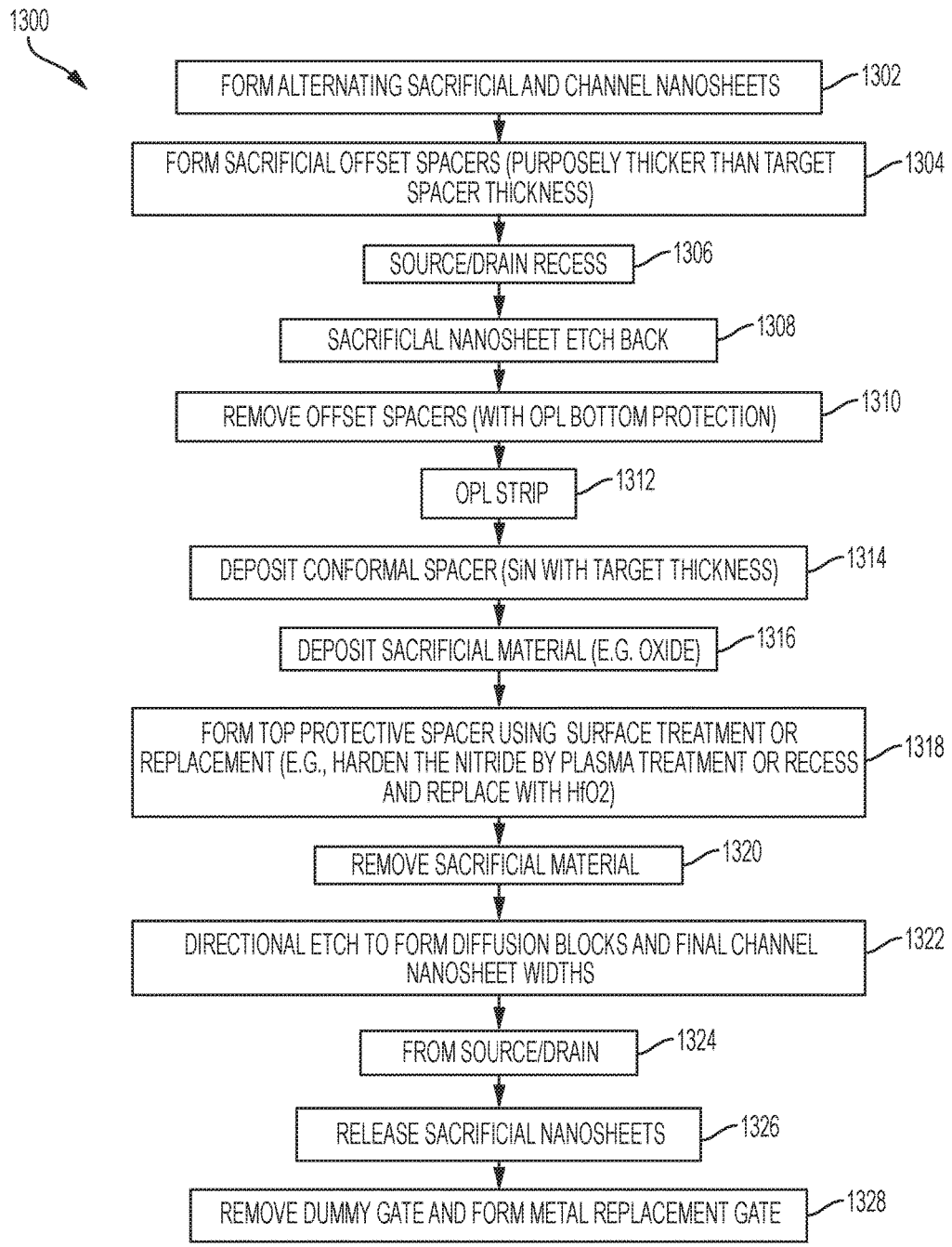
FIG. 13 is a flow diagram illustrating a methodology according to one or more embodiments of the present invention.

FIG. 13 is a flow diagram illustrating a methodology 1300 according to one or more embodiments. At block 1302 alternating sacrificial and channel nanosheets are formed. Block 1304 forms sacrificial offset spacers (purposely thicker than target spacer thickness). Block 1306 forms recesses in which the source and drain regions will be formed. Block 1308 etches back the sacrificial nanosheets to form cavities (e.g., cavities 402 shown in FIG. 4). The cavities are formed by the removal of sidewall portions of the sacrificial nanosheets by selectively etching the sacrificial nanosheets from the outside wall of the offset spacers (e.g., spacers 202 shown in FIG. 2) to the dummy gates (e.g., dummy gates 150 shown in FIG. 1). Block 1310 forms a bottom OPL for protection, and then removes the offset spacers. Block 1312 strips the OPL. Block 1314 deposits a conformal spacer (e.g., SiN with target thickness). Block 1316 deposits a sacrificial protective layer (e.g., protective layer 802 shown in FIG. 8). Block 1318 forms top protective spacer (e.g., top protective spacer 902 shown in FIG. 9) using surface treatment or replacement (e.g., harden the nitride spacer by plasma treatment, or recess and replace with $HfO_2$). Block 1320 removes the sacrificial protective layer. Block 1322 applies a directional etch to form diffusion blocks (e.g., diffusion blocks 1102 shown in FIG. 11) and the final channel nanosheet widths Wf. Block 1324 grows source/drain regions such that the diffusion blocks are between the sacrificial nanosheets and the source/drain regions. Growing the source/drain regions can include in-situ doping to form the necessary junctions for either n-type or p-type nanosheet FET devices, including, optionally, extension junctions in the nanosheets at the interface between the nanosheets and the source/drain regions. Block 1326 removes the sacrificial nanosheets using a sacrificial nanosheet removal process such as an etching process. Block 1328 removes the dummy gates, and also forms a replacement metal gate. The diffusion blocks prevent the sacrificial layer etching process from laterally etching the source/drain regions.

The methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the embodiments in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of fabricating inner spacers of a nanosheet field effect transistor, the method comprising:
    forming a sacrificial nanosheet and a channel nanosheet over a substrate;
    removing a sidewall portion of the sacrificial nanosheet;
    forming a dielectric that extends over the channel nanosheet and within a space that was occupied by the removed sidewall portion of the sacrificial nanosheet;
    forming a top protective spacer over the channel nanosheet and the dielectric; and
    applying a directional etch to the top protective spacer, the channel nanosheet, and the dielectric, wherein the directional etch is configured to be selective to the channel nanosheet and the dielectric, wherein the directional etch is configured to not be selective to the top protective spacer, wherein applying the directional etch etches a portion of the channel nanosheet and a portion of the dielectric that are not under the top protective spacer.

2. The method of claim 1, wherein the portion of the dielectric that is under the top protective spacer and within the space that was occupied by the removed sidewall portion of the sacrificial nanosheet comprises a diffusion block.

3. The method of claim 2, wherein, subsequent to applying the directional etch, a vertical sidewall of the diffusion block is substantially planar with a vertical sidewall of the channel nanosheet.

4. The method of claim 3 further comprising forming a source region and a drain region such that the diffusion block is between the sacrificial nanosheet and at least one of the source region and the drain region.

5. The method of claim 4 further comprising removing the sacrificial layer using a sacrificial nanosheet removal process, wherein the diffusion block prevents the sacrificial nanosheet removal process from also removing portions of at least one of the source region and the drain region.

6. The method of claim 5 further comprising forming a gate region around the channel nanosheet, wherein the gate region is configured to control a flow of current from the source region through the channel nanosheet into the drain region.

7. The method of claim 5 further comprising providing dopant in the source region or the drain region to form at least one junction.

8. The method of claim 7, wherein the at least one junction comprises an extension junction of the channel nanosheet.

9. The method of claim 5, wherein the sacrificial nanosheet removal process comprises a wet process.

10. The method of claim 9, wherein a selectivity of the wet process to the diffusion block is below a predetermined threshold.

11. The method of claim 9, wherein the wet process comprises an etch.

12. The method of claim 11, wherein the etch comprises a reactive ion etch.

13. The method of claim 12, wherein the reactive ion etch causes an etch rate of the diffusion block that is below a predetermined threshold.

14. The method of claim 1, wherein forming of the sacrificial nanosheet and the channel nanosheet comprises forming a stack comprising alternating sacrificial nanosheets and channel nanosheets.

15. The method of claim 14, wherein:
    the top protective spacer comprises hafnium oxide;
    the dielectric comprises silicon nitride;
    the sacrificial nanosheet comprises silicon germanium; and
    the channel nanosheet comprises silicon.

16. A method of fabricating inner spacers of a nanosheet field effect transistor, the method comprising:
    forming a substrate;
    forming a sacrificial nanosheet over the substrate;
    forming a channel nanosheet over the sacrificial nanosheet;
    forming a dummy gate over the channel nanosheet;
    removing a sidewall portion of the sacrificial nanosheet;
    forming a dielectric that extends over the channel nanosheet and within a space that was occupied by the removed sidewall portion of the sacrificial nanosheet;
    forming a top protective spacer over the dummy gate, wherein the top protective spacer comprises a predetermined width dimension; and
    applying a directional etch to the top protective spacer, the channel nanosheet, and the dielectric;
    wherein the directional etch is configured to be selective to the channel nanosheet and the dielectric;
    wherein the directional etch is configured to not be selective to the top protective spacer;
    wherein applying the directional etch etches a portion of the channel nanosheet and a portion of the dielectric that are not under the top protective spacer;
    wherein the portion of the dielectric that is under the top protective spacer and within the space that was occupied by the removed sidewall portion of the sacrificial nanosheet comprises a diffusion block;
    wherein, subsequent to applying the directional etch, a width dimension of the channel substrate is substantially the same as the width dimension of the channel nanosheet;
    wherein, subsequent to applying the directional etch, a vertical sidewall of the diffusion block is substantially planar with a vertical sidewall of the channel nanosheet.

17. The method of claim 16 further comprising:
    forming a source region and a drain region such that the diffusion block is between the sacrificial nanosheet and at least one of the source region and the drain region; and
    removing the sacrificial layer using a sacrificial nanosheet removal process;

wherein the diffusion block prevents the sacrificial nanosheet removal process from also removing portions of at least one of the source region and the drain region.

18. The method of claim 17, wherein:
the sacrificial nanosheet removal process comprises a wet process;
a selectivity of the wet process to the diffusion block is below a predetermined threshold.

19. The method of claim 16, wherein:
the top protective spacer comprises hafnium oxide;
the dielectric comprises silicon nitride;
the sacrificial nanosheet comprises silicon germanium; and
the channel nanosheet comprises silicon.

* * * * *